US005168279A

United States Patent [19]

Knight

[11] Patent Number: 5,168,279

[45] Date of Patent: Dec. 1, 1992

[54] ANTENNA FOR SENSING STRAY RF RADIATION

[75] Inventor: Jeffrey B. Knight, Spokane, Wash.

[73] Assignee: Hewlett-Packard Company, Palo Alto, Calif.

[21] Appl. No.: 714,472

[22] Filed: Jun. 12, 1991

[51] Int. Cl.[5] ..................... G01R 29/80; H01Q 9/140; H01Q 9/220; H01Q 1/400

[52] U.S. Cl. .................................. 343/703; 343/793; 343/823; 343/872; 324/95

[58] Field of Search ............... 343/872, 873, 793, 794, 343/801, 802, 805, 823, 703, 792; 324/72, 72.5, 84.95

[56] References Cited

U.S. PATENT DOCUMENTS

| | | | |
|---|---|---|---|
| 2,563,243 | 8/1951 | Hills | 343/872 |
| 3,030,622 | 4/1962 | Leitner et al. | 343/872 |
| 3,056,925 | 10/1962 | Borck et al. | 343/703 |
| 3,335,420 | 8/1967 | Silliman | 343/872 |
| 3,961,332 | 6/1976 | Middlemark | 343/793 |

OTHER PUBLICATIONS

Kraus, *Antennas,* Excerpt from Chapter 1, McGraw-Hill, 1950, pp.8-10.

HP 8554A Synthesized Signal Generator, Hewlett-Packard brochure, Oct. 1990, pp.1-8.

*Primary Examiner*—Rolf Hille

*Assistant Examiner*—Peter Toby Brown

[57] ABSTRACT

An antenna for sensing stray RF radiation, such as from electronic equipment, is positioned within a dielectric enclosure. For the case of a dipole sensing antenna, the enclosure may take the form of a clear acrylic (i.e., Plexiglas) tube. This tube assures that no part of the equipment-under-test can be positioned nearer to the dipole antenna than the desired distance (which is fixed by the radius of the tube). The dipole elements themselves may be maintained coaxially disposed within the tube by spacer disks. If the dipole elements are telescopic, their lengths can readily be set by attaching the spacer disks to the outer-most telescoping member of each element and moving the spacer disks (and in so doing moving the ends of the dipole elements) into alignment with markings disposed on the tube. These markings may be calibrated either in terms of distance or the corresponding resonant frequency.

7 Claims, 2 Drawing Sheets

ANTENNA FOR SENSING STRAY RF RADIATION

FIELD OF THE INVENTION

The present invention relates generally to antennas, and more particularly relates to antennas adapted to sense RF leakage from electronic equipment.

BACKGROUND AND SUMMARY OF THE INVENTION

Almost all electronic equipment emits, to one degree or another, stray electromagnetic radiation. Such radiation is undesirable for a number of reasons, the most important of which is usually interference with other electronic equipment.

To measure stray radiation, an apparatus comprising a spectrum analyzer, an amplifier, and a sensing antenna is commonly used. The sensing antenna is positioned at a specified distance from the equipment-under-test and picks up stray radiation. The spectrum analyzer measures the amplitude of this radiation as a function of frequency.

The distance between the equipment-under-test and the sensing antenna is a critical variable in making stray radiation measurements. Even a slight change in distance can produce a significant change in detected radiation, especially for measurements made in the "near field" of the equipment. Since stray radiation measurements must be taken on all sides of the equipment to assure compliance with applicable standards, it is important that all measurements be taken from the same distance.

In making "far field" measurements, it is possible to probe the stray radiation field at a plurality of uniformly distant points by selecting probe positions on an imaginary sphere surrounding the equipment.

In making near field measurements, the problem becomes more difficult. No longer will a spherical measurement geometry suffice. Rather, the instrument must usually be probed a fixed distance from its cabinet - often just a few inches away. Further, as noted, even slight non-uniformities in measurement distances can corrupt the resulting data, since the nominal measurement distance may only be an inch or two.

The prior art solution to maintaining a uniform sensing distance under these circumstances is to equip a sensing antenna with one or more dielectric spacing members. For the case of a dipole sensing antenna, one dielectric spacing disk is concentrically mounted near the end of each of the dipole elements. (For expository lo convenience, the prior art is discussed with reference to a dipole sensing antenna, although loop sensing antennae are also commonly used.) The peripheries of these disks rest against the cabinet of the equipment-under-test as the antenna is moved over the equipment, thereby maintaining a fixed distance between the cabinet and the antenna.

The prior art dipole sensing antenna is equipped with a handle that attaches thereto at its midpoint and through which a feedline connects to the two dipole elements. Usually, six or more dipoles of different lengths are required to cover an octave of frequency, such as 500 MHz–1 GHz.

While the foregoing approach has many advantages, it nonetheless has serious failings. One arises when probing over equipment surfaces that are not flat. Many equipment cabinets, for example have knobs or connectors that protrude from their surfaces. These protrusions can extend much closer to the dipole elements than the distance set by the dielectric spacer disks. In extreme cases, the protrusions may even touch the sense antenna. Related problems occur when probing near edges of equipment cabinets. One dielectric spacer disk may extend off a surface of the cabinet, permitting the portion of the antenna between the disks to drop unacceptably close to the edge of the cabinet. FIG. 1 illustrates these failings.

In accordance with the present invention, the foregoing and additional drawbacks of the prior art are solved by positioning a sensing antenna within a dielectric enclosure. For the case of a dipole sensing antenna, the enclosure may take the form of a clear acrylic (i.e., Plexiglas) tube. This tube assures that no part of the equipment-under-test can be positioned nearer to the dipole antenna than the desired distance (which is fixed by the radius of the tube). The dipole elements themselves may be maintained coaxially disposed within the tube by spacer disks. If the dipole elements are telescopic, their lengths can readily be set by attaching the spacer disks to the outer-most telescoping member of each element and moving the spacer disks (and in so doing moving the ends of the dipole elements) into alignment with markings disposed on the acrylic tube. These markings may be calibrated either in terms of distance or the corresponding resonant frequency.

The foregoing and additional objects, features and advantages of the present invention will be more readily apparent from the following detailed description thereof, which proceeds with reference to the accompanying drawings.

DETAILED DESCRIPTION

Figure 3:
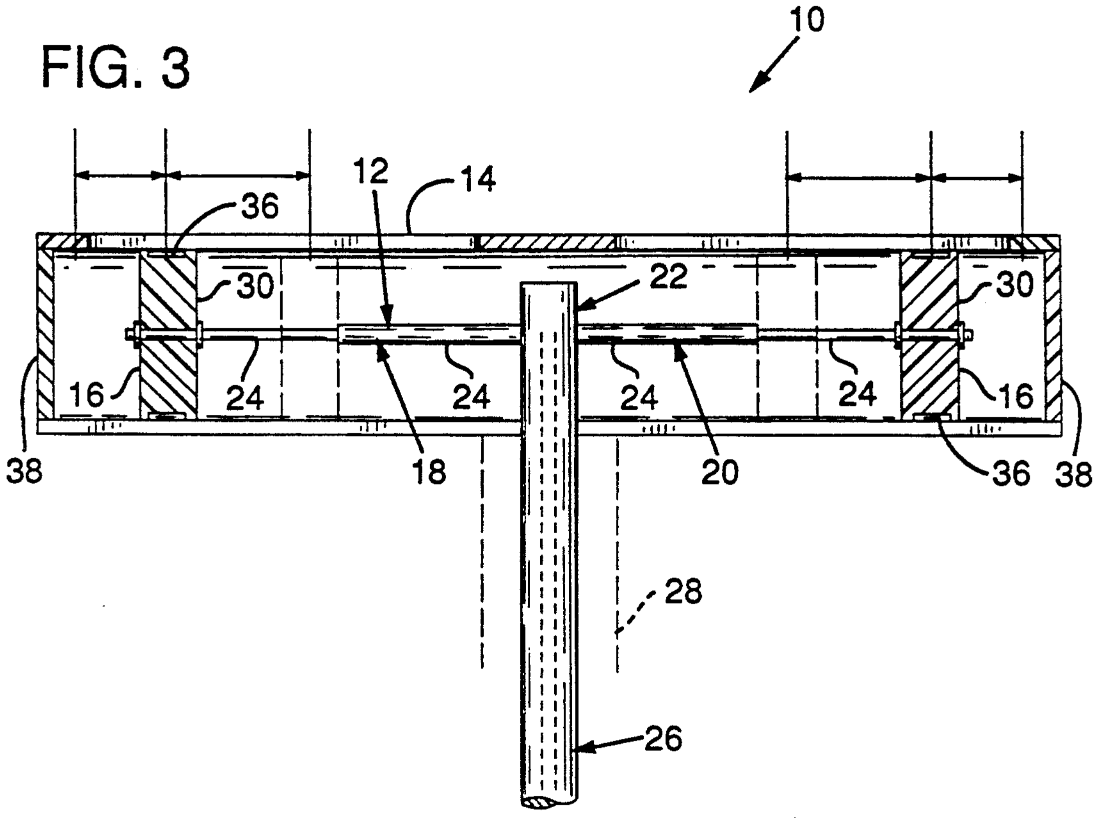
FIG. 3 is an isometric view of the sensing antenna of FIG. 2.
Figure 1:
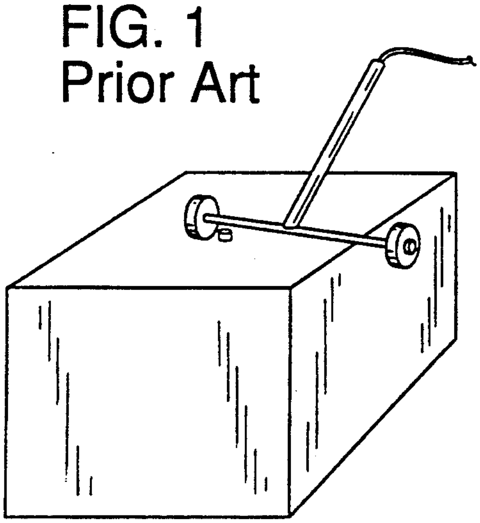
FIG. 1 Prior Art
FIG. 1 is a view illustrating a prior art sensing antenna and its use to sense stray electromagnetic radiation from an equipment enclosure.
Figure 4:
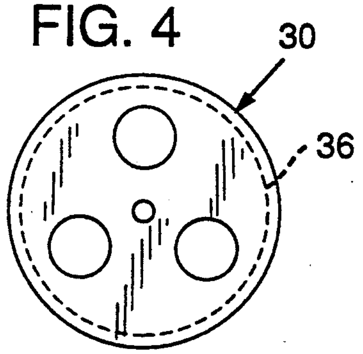
FIG. 4 is a plan view of a spacer element used in the sensing antenna of FIG. 2.
Figure 2:
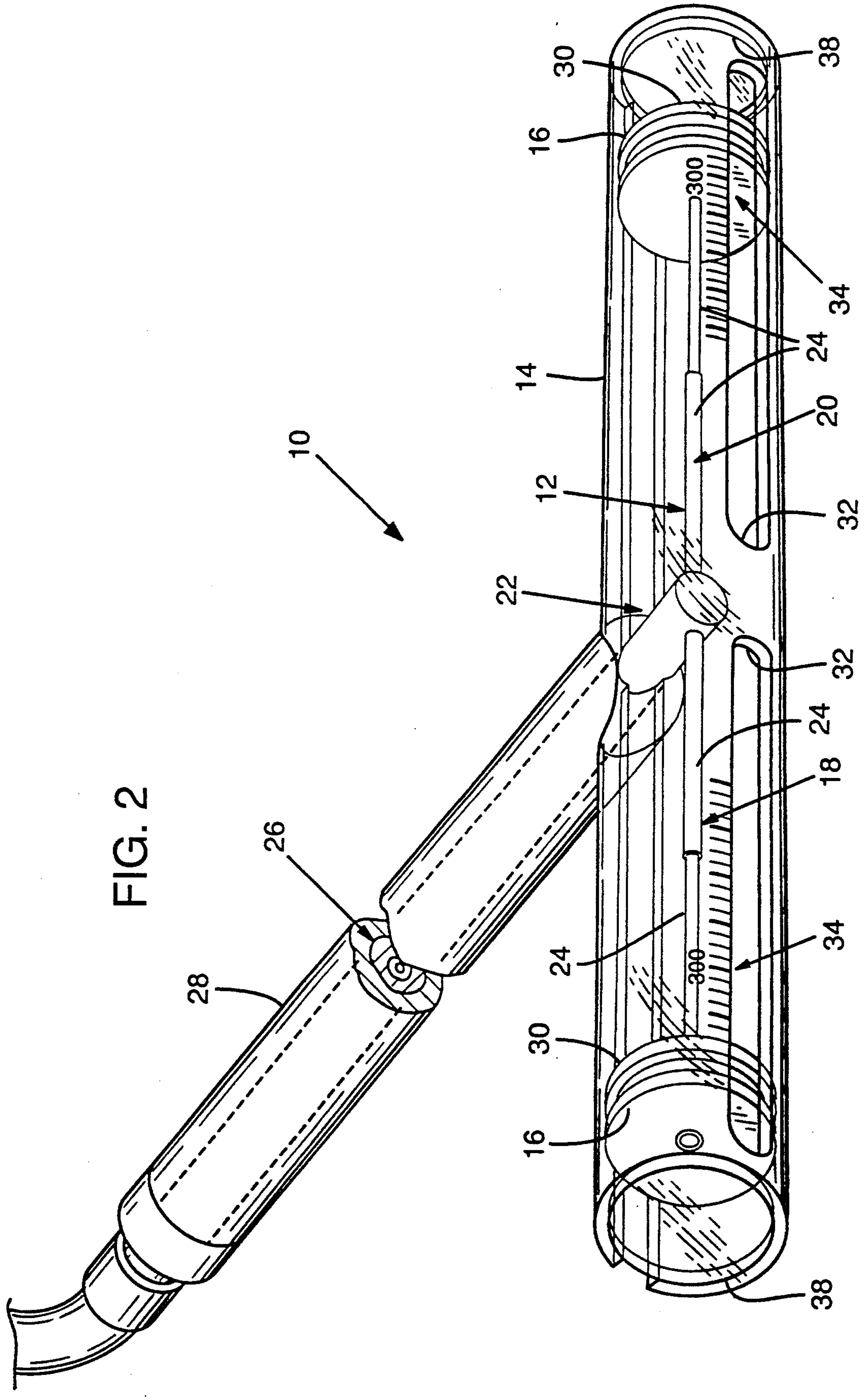
FIG. 2 is a sectional view of a sensing antenna according to one embodiment of the present invention.

Referring to FIGS. 2–4, a sensing antenna 10 according to one embodiment of the present invention includes a dipole antenna 12, a tubular dielectric enclosure 14, and means 16 for maintaining the dipole antenna coaxially disposed within the enclosure.

The illustrated dipole antenna 12 comprises first and second dipole elements 18, 20 that extend in opposite directions from a feed point 22. The elements 18, 20 each include a plurality of individual members 24 that are telescopically related so that the length of each dipole element can be adjusted. From the feed point 22 extends a coaxial feedline 26 that may be disposed within a handle 28. On the end of the handle 28 is a coaxial connector that is used to couple, through the feedline 26, to the dipole.

The above-detailed elements of the dipole antenna 12 can be purchased as a single assembly from The Electro Mechanics Co. as Part No. 3121 C DB4. This assembly also includes a balun interposed between the coaxial feedline and the dipole and positioned within the handle 28.

Radially surrounding the dipole elements 18, 20 of the dipole antenna 12 is the tubular dielectric enclosure 14. In the illustrated embodiment, this enclosure is machined from a tube of Plexiglas brand acrylic having an outer diameter of approximately 1.75 inches.

To maintain uniform radial spacing between the antenna elements 18, 20 and the dielectric enclosure, applicant employs a plurality of spacer disks 30, one for each element. Each spacer disk is desirably mounted to the end-most telescoping member 24 of each dipole element so that the spacer disk moves as the antenna is lengthened or shortened. The enclosure 14 is desirably slotted, such as by slots 32, so that the spacer elements can be manually manipulated therethrough to adjust the lengths of the associated dipole elements. Calibrations 34 can be marked on the enclosure 14 and read against an indicator on disks 30 to indicate either the dipole length or the resonant frequency to which the dipole length corresponds.

The disks 30 can thus be seen to serve a multitude of functions: centering the dipole elements within the enclosure 14, providing a means by which the lengths of the dipole elements can be adjusted from outside the enclosure, and indicating either the length or the resonant frequency of the sense antenna.

At ultra high frequencies, the characteristics of the spacer disks 30 become somewhat critical. To minimize adverse loading effects, the spacer disks 30 in the illustrated embodiment are formed of Teflon. Further, they may be drilled out, as shown in FIG. 4, to further reduce their mass and attendant loading effects. The disks may also be scored, such as by a circumferential groove 36 (FIG. 3), to permit the disks to more easily travel within the close confines of enclosure 14.

In the preferred embodiment, the openings at the ends of the dielectric tube 14 are closed by acrylic disks 38 to prevent extraneous objects from approaching the ends of the dipole antenna.

From the foregoing, it will be recognized that the present invention provides an advantageous sensing antenna that overcomes the disadvantages of the prior art and provides new features, such as frequency and length calibrations, as well.

Having described and illustrated the principles of my invention with reference to a preferred embodiment, it will be apparent that the invention can be modified in arrangement and detail without departing from such principles. For example, while the invention has been illustrated with reference to a dipole sensing antenna, it will be recognized that in other embodiments different antenna configurations may be employed. Circular loop antennas are one such alternative configuration and may be mounted in a pancake-shaped dielectric spacing enclosure.

In view of the wide variety of embodiments to which the principles of my invention may be applied, it should be apparent that the detailed embodiment is illustrative only and should not be taken as limiting the scope of my invention. Rather, I claim as my invention all such modifications as may come within the scope and spirit of the following claims and equivalents thereto.

I claim:

1. An apparatus for sensing radiation from an instrument, the apparatus comprising:

a tubular dielectric enclosure;

a dipole antenna coaxially disposed within the tubular dielectric enclosure and including first and second dipole antenna elements, each of said dipole elements having a substantially uniform, circular cross section along its length so that a distance between the element and the enclosure is substantially constant along the element's length;

the enclosure and the antenna defining an annular volume of air therebetween;

spacer elements, one being disposed on each of said dipole elements, the spacer elements maintaining the dipole antenna coaxially positioned with the tubular enclosure; and a handle including a feedline coupled to the dipole antenna and extending perpendicularly away therefrom.

2. The apparatus of claim 1 in which the dielectric enclosure has a diameter at least four times that of the dipole antenna and in which a radial distance between the dipole antenna and the surrounding tubular enclosure is at least twice the radius of the dipole antenna.

3. An apparatus for sensing radiation from an instrument, the apparatus comprising:

a tubular dielectric enclosure;

a dipole antenna coaxially disposed within the tubular dielectric enclosure and including first and second dipole antenna elements, each dipole element including a telescoping portion;

the enclosure and the antenna defining an annular volume of air therebetween;

spacer elements, one being disposed on each of said dipole elements, the spacer elements maintaining the dipole antenna coaxially positioned with the tubular enclosure, the spacer elements being disposed on the telescoping portions of the dipole elements and being movable therewith as the lengths of the dipole elements are adjusted; and a handle including a feedline coupled to the dipole antenna and extending perpendicularly away therefrom.

4. The apparatus of claim 3 which further includes calibrations disposed on the apparatus facilitating adjustment of the dipole elements to desired lengths.

5. The apparatus of claim 4 in which the tubular dielectric enclosure is transparent and the calibrations are disposed thereon.

6. The apparatus of claim 3 in which the tubular dielectric enclosure defines longitudinal slots through which the spacer elements can be manipulated to adjust the lengths of the first and second dipole elements.

7. A method of sensing stray RF radiation from an equipment enclosure that has a protrusion or corner thereon, the method comprising the steps:

providing a sensing apparatus that includes a sensing antenna disposed within a dielectric housing, the antenna being spaced from the outside of the dielectric housing by a substantially uniform distance;

probing a region of the equipment enclosure that includes said protrusion or corner by:

positioning the sensing apparatus in abutment with said region of the equipment enclosure;

moving the apparatus to different positions, including into abutment with said protrusion or corner, while maintaining the apparatus in abutment with the enclosure; and regardless of the position to which the apparatus is moved, and irrespective of the dimensions of said protrusion or corner, the dielectric housing preventing said protrusion or corner from approaching the sensing antenna more closely than said uniform distance.

* * * * *